United States Patent
Leirer et al.

(10) Patent No.: US 10,121,775 B2
(45) Date of Patent: Nov. 6, 2018

(54) OPTOELECTRONIC SEMICONDUCTOR CHIP WITH BUILT-IN ESD PROTECTION

(71) Applicant: OSRAM Opto Semiconductors GmbH, Regensburg (DE)

(72) Inventors: Christian Leirer, Friedberg (DE); Berthold Hahn, Hemau (DE); Karl Engl, Pentling (DE); Johannes Baur, Regensburg (DE); Siegfried Herrmann, Neukirchen (DE); Andreas Ploessl, Regensburg (DE); Simeon Katz, Obertraubling (DE); Tobias Meyer, Regensburg (DE); Lorenzo Zini, Regensburg (DE); Markus Maute, Alteglofsheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/038,034

(22) PCT Filed: Nov. 7, 2014

(86) PCT No.: PCT/EP2014/074071
§ 371 (c)(1),
(2) Date: May 19, 2016

(87) PCT Pub. No.: WO2015/074900
PCT Pub. Date: May 28, 2015

(65) Prior Publication Data
US 2016/0300829 A1    Oct. 13, 2016

(30) Foreign Application Priority Data

Nov. 21, 2013 (DE) .......................... 10 2013 112 881

(51) Int. Cl.
*H01L 33/00* (2010.01)
*H01L 27/02* (2006.01)
(Continued)

(52) U.S. Cl.
CPC ........ *H01L 27/0248* (2013.01); *H01L 25/167* (2013.01); *H01L 27/15* (2013.01);
(Continued)

(58) Field of Classification Search
CPC ... H01L 27/0248; H01L 33/32; H01L 25/167; H01L 27/15; H01L 33/382; H01L 33/62;
(Continued)

(56) References Cited

U.S. PATENT DOCUMENTS 3,496,512 A    2/1970   Matsuoka et al.
4,551,268 A    11/1985  Eda et al.
(Continued)

FOREIGN PATENT DOCUMENTS

CN    1652346 A      8/2005
CN    103094274 A    5/2013
(Continued)

OTHER PUBLICATIONS

Kim, J. et al, "investigation of Reverse Leakage Characteristics of InGaN/GaN Light-Emitting Diodes on Silicon", IEEE Electron Device Letters, vol. 33, No. 12, Dec. 2012, pp. 1741-1743.
(Continued)

*Primary Examiner* — Ismail Muse
(74) *Attorney, Agent, or Firm* — McDermott Will & Emery LLP

(57) ABSTRACT

Described is an optoelectronic semiconductor chip (1) with a built-in bridging element (9, 9A) for overvoltage protection.

12 Claims, 7 Drawing Sheets

Figure 4:
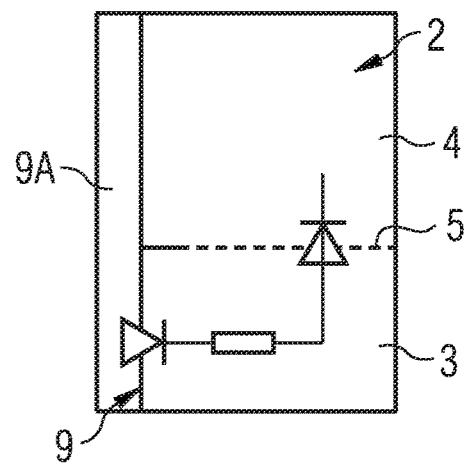

(51) Int. Cl.
*H01L 25/16* (2006.01)
*H01L 27/15* (2006.01)
*H01L 33/62* (2010.01)
*H01L 25/075* (2006.01)
*H01L 33/38* (2010.01)

(52) U.S. Cl.
CPC .......... *H01L 33/62* (2013.01); *H01L 25/0753* (2013.01); *H01L 33/387* (2013.01); *H01L 2224/48091* (2013.01)

(58) Field of Classification Search
CPC ....... H01L 2224/48091; H01L 25/0753; H01L 33/387
See application file for complete search history.

(56) References Cited

U.S. PATENT DOCUMENTS

| | | | | |
|---|---|---|---|---|
| 8,436,373 | B2* | 5/2013 | Mizutani | H01L 27/156 257/100 |
| 2005/0168899 | A1 | 8/2005 | Sato et al. | |
| 2005/0184387 | A1 | 8/2005 | Collins et al. | |
| 2007/0246716 | A1* | 10/2007 | Bhat | H01L 27/15 257/81 |
| 2007/0258500 | A1* | 11/2007 | Albrecht | H01L 27/15 372/50.11 |
| 2008/0105885 | A1 | 5/2008 | Watanabe et al. | |
| 2008/0149951 | A1 | 6/2008 | Lin et al. | |
| 2010/0171135 | A1* | 7/2010 | Engl | H01L 33/382 257/98 |
| 2011/0180831 | A1 | 7/2011 | Song | |
| 2011/0215358 | A1* | 9/2011 | Hwang | H01L 27/15 257/98 |
| 2011/0241031 | A1* | 10/2011 | von Malm | H01L 27/156 257/88 |
| 2011/0272728 | A1 | 11/2011 | Rode et al. | |
| 2012/0001221 | A1 | 1/2012 | Choi | |
| 2012/0018763 | A1* | 1/2012 | Engl | H01L 27/15 257/99 |
| 2012/0098025 | A1* | 4/2012 | Hoppel | H01L 33/486 257/99 |
| 2012/0211773 | A1 | 8/2012 | Fleming et al. | |
| 2013/0062638 | A1* | 3/2013 | Onushkin | H01L 33/382 257/98 |
| 2013/0207154 | A1* | 8/2013 | Hoppel | H01L 25/167 257/99 |
| 2013/0292735 | A1 | 11/2013 | Hoeppel | |

FOREIGN PATENT DOCUMENTS

| | | |
|---|---|---|
| DE | 10329082 A1 | 10/2004 |
| DE | 102007013986 A1 | 9/2008 |
| DE | 102007057672 A1 | 6/2009 |
| DE | 102007062046 A1 | 6/2009 |
| DE | 102012207772 A1 | 11/2013 |
| EP | 2365544 A1 | 9/2011 |
| EP | 2402995 A2 | 1/2012 |
| JP | 2005136177 A | 5/2005 |
| JP | 2005244220 A | 9/2005 |
| JP | 2006066863 A | 3/2006 |
| JP | 2008108816 A | 5/2008 |
| JP | 2010171167 A | 8/2010 |
| JP | 2011520270 A | 7/2011 |
| JP | 2011187958 A | 9/2011 |
| JP | 2011528855 A | 11/2011 |
| JP | 2012510173 A | 4/2012 |
| JP | 2012-109501 A | 6/2012 |
| WO | 2008154573 A1 | 12/2008 |
| WO | 2011080219 A1 | 7/2011 |
| WO | WO-2012080015 A1 | 6/2012 |
| WO | 2012146668 A1 | 11/2012 |

OTHER PUBLICATIONS

Chang, K. et al, "Microstructure and Electrical Properties of Zinc Oxide Thin Film Varistors Prepared by RF Sputtering", Materials Research Society Symposium—Proceeding; 2004; vol. 786; pp. 347-352.

Gupta, Tapan K., "Application of Zinc Oxide Varistors", Journal of American Ceramic Society 73 (7), 1990, pp. 1317-1340.

Kojima, A. et al., "A Fully Integrated Novel Wafer-Level LED Package (WL2P) Technology for Extremely Low-Cost Solid State Lighting Devices", IEEE International Interconnect Technology Conference; IITC 2012, San Jose, CA; Jun. 4-6, 2012.

Fan, X., "Wafer Level System Packaging and Integration for Solid State Lighting (SSL)", 13th International Conference on Thermal, Mechanical and Multi-Physics Simulation and Experiments in Microelectronics and Microsystems; EuroSimE 2012; IEEE, pp. 1-6.

* cited by examiner

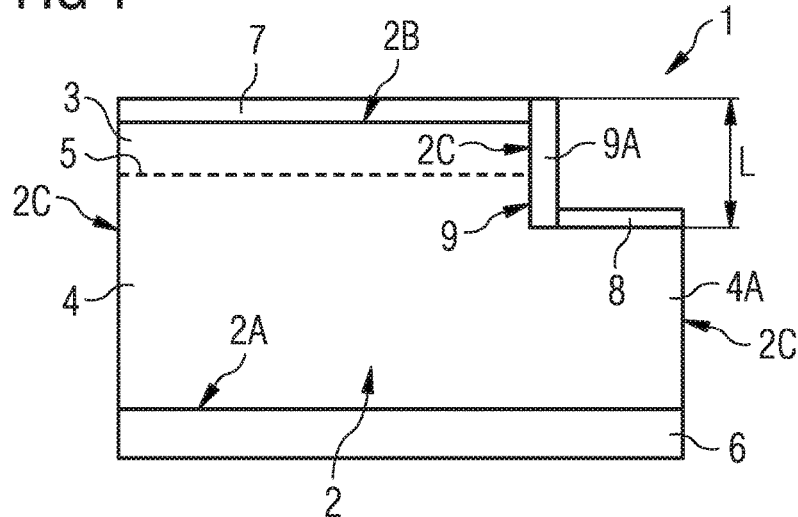
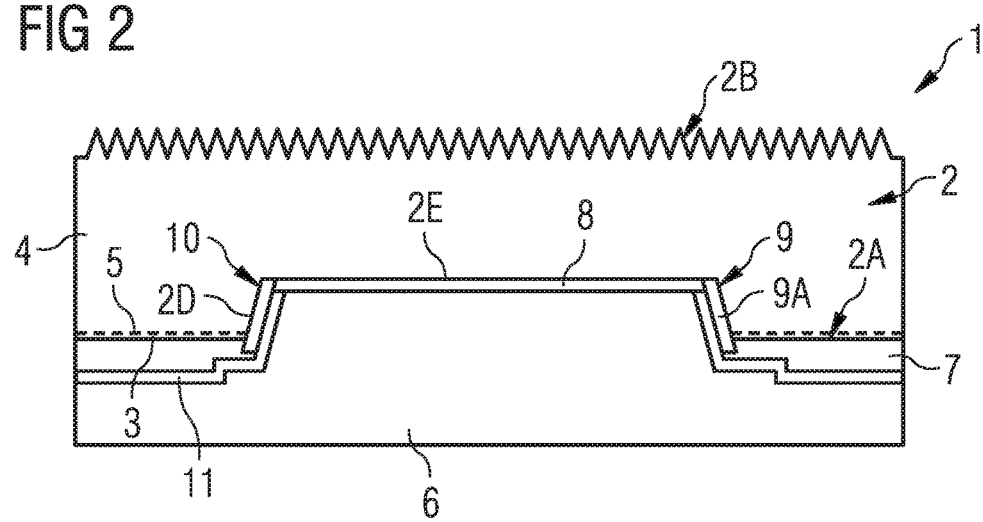
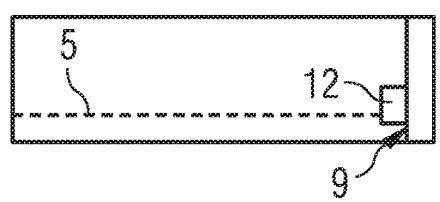

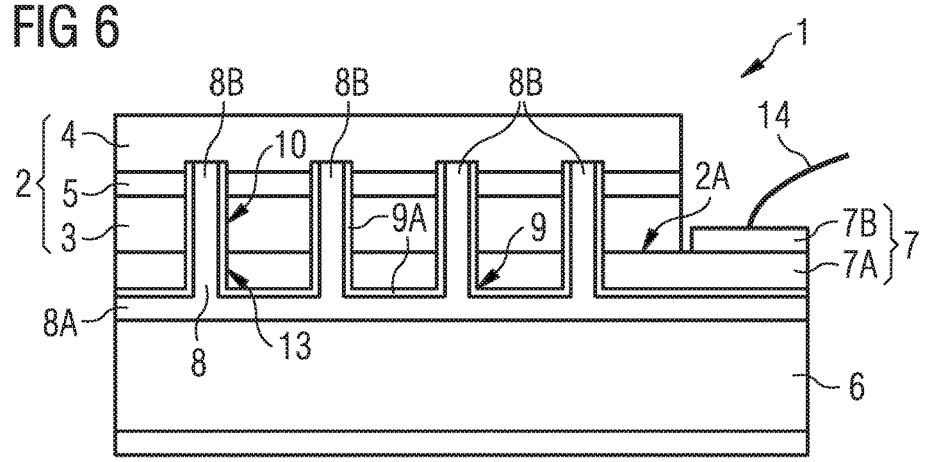
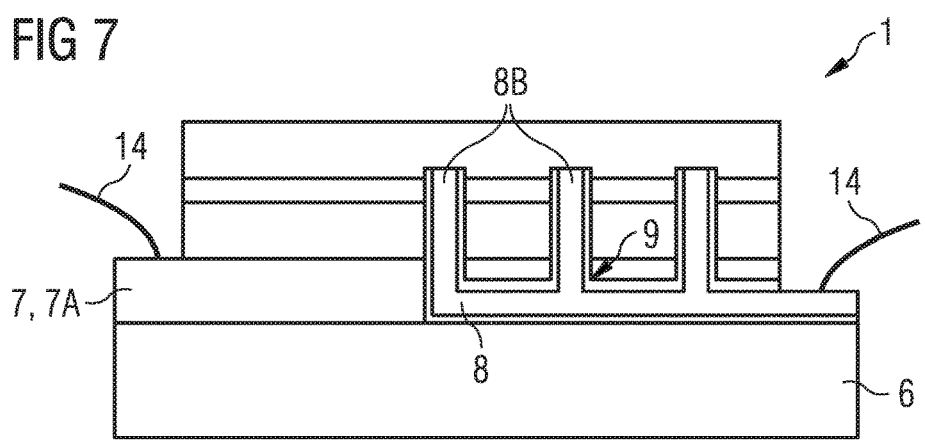
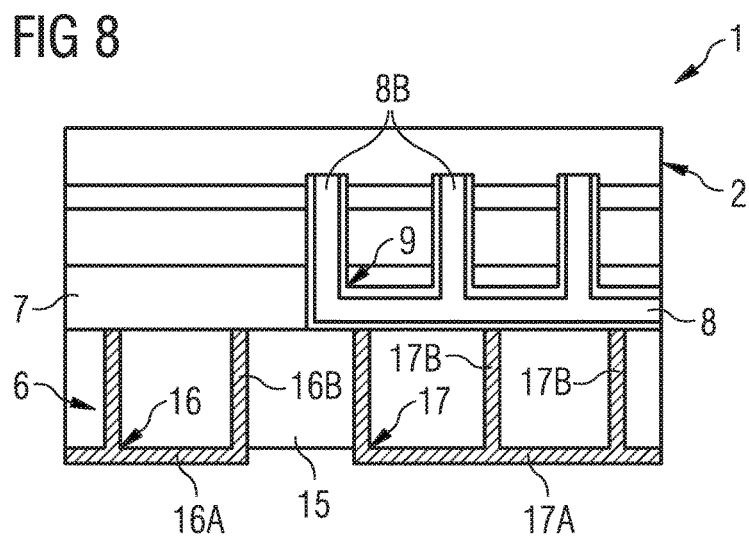

OPTOELECTRONIC SEMICONDUCTOR CHIP WITH BUILT-IN ESD PROTECTION

An optoelectronic semiconductor chip is provided, which is provided in particular for emitting radiation.

To allow stable operation of an optoelectronic device and also largely to prevent permanent damage to the device in the case of electrostatic discharges and/or electrical overload, protective measures are advantageous.

Document WO 2012/146668, for example, describes the protective measure of providing in a semiconductor layer sequence of a semiconductor chip an epitaxial protective layer which comprises deliberately introduced crystal defects, wherein, when the semiconductor chip is in operation, breakdown behavior of the semiconductor layer sequence in the reverse direction is different in regions with crystal defects from in regions without crystal defects, and wherein, in the event of electrostatic discharge pulses, electrical charge is discharged in a manner distributed uniformly over the regions with crystal defects. Furthermore, in document WO 2011/080219 an optoelectronic semiconductor chip is provided with a semiconductor layer sequence which comprises a plurality of microdiodes, wherein the microdiodes form ESD (Electro Static Discharge) protection. However, such protective measures in the semiconductor layer sequence are associated with losses of semiconductor chip optical efficiency.

Moreover, it is known for example from document DE 10329082 to use a separate protective element, for example a protective diode, and to interconnect said element with the semiconductor chip. However, this entails additional space and costs.

One object to be achieved consists in the present case in providing an improved optoelectronic semiconductor chip with integrated ESD protection.

According to at least one embodiment, the optoelectronic semiconductor chip comprises a semiconductor layer sequence containing a semiconductor material and comprising a first semiconductor region of a first conductivity type and a second semiconductor region of a second conductivity type and an active zone with a pn junction, which is formed between the first and second semiconductor regions. In particular, the active zone may be provided for generating radiation.

Furthermore, the first conductivity is designated p-conductivity and the second conductivity is designated n-conductivity. The first semiconductor region may for example be arranged on a side of the active zone which faces a carrier. And the second semiconductor region may be arranged on a side of the active zone remote from the carrier. The first semiconductor region preferably comprises at least one semiconductor layer, which has doping of the first conductivity type. The second semiconductor region accordingly comprises in particular at least one semiconductor layer, which has doping of the second conductivity type.

Suitable materials for the semiconductor layers are for example materials based on nitride compound semiconductors. In the present context, "based on nitride compound semiconductors" means that the semiconductor layer sequence or at least one layer thereof comprises a nitride III-V compound semiconductor material, preferably $Al_nGa_mIn_{1-n-m}N$, wherein $0 \leq n \leq 1$, $0 \leq m \leq 1$ and $n+m \leq 1$. This material does not absolutely have to exhibit a mathematically exact composition according to the above formula. Instead, it may comprise one or more dopants and additional constituents which do not substantially modify the characteristic physical properties of the $Al_nGa_mIn_{1-n-m}N$ material. For simplicity's sake, however, the above formula includes only the fundamental constituents of the crystal lattice (Al, Ga, In, N), even if these may in part be replaced by small quantities of further substances.

In one advantageous embodiment, the optoelectronic semiconductor chip comprises a carrier on which the semiconductor layer sequence is arranged. The semiconductor chip may for example be a thin-film semiconductor chip, from which a growth substrate, on which the semiconductor layer sequence has been grown, is at least partially detached. The growth substrate may for example be replaced by the carrier.

Furthermore, the optoelectronic semiconductor chip may comprise a first contact, which is provided for electrical connection of the first semiconductor region, and a second contact different from the first contact, which is provided for electrical connection of the second semiconductor region. In particular, the first contact is a p-contact and the second contact is an n-contact.

According to at least one embodiment, the optoelectronic semiconductor chip comprises a bridging element. In particular, the bridging element is connected parallel or antiparallel to the semiconductor layer sequence. For example, the bridging element may have the current/voltage behavior of a diode. In this case, the bridging element is preferably connected antiparallel to the semiconductor layer sequence. Furthermore, the bridging element may have the current/voltage behavior of a varistor. In this case, the bridging element may be connected parallel or antiparallel to the semiconductor layer sequence. The current/voltage behavior of the varistor may be virtually identical in the forward and reverse directions. In this way, overvoltages both in the reverse direction and in the forward direction can be limited.

Advantageously, the bridging element comprises a nonlinear electrical resistance, which is higher in the case of an operating voltage of the optoelectronic semiconductor chip in the forward direction than an electrical resistance of the semiconductor layer sequence and is lower in the case of overvoltages in the reverse direction than the electrical resistance of the semiconductor layer sequence, such that electrical charge is discharged via the bridging element in the case of overvoltages. In this way, the semiconductor layer sequence may be protected from electrostatic discharge pulses and thus damage to the semiconductor chip may be largely prevented.

According to at least one embodiment, the bridging element contains a polycrystalline electroceramic material. Suitable electroceramic materials are for example sintered semiconductor materials. Materials such as zinc oxide, strontium oxide, strontium titanate, titanium oxide and silicon carbide may in particular be considered for the bridging element. Resistance may be influenced in particular by the grain size of the material used. When such materials are used, the bridging element in particular has the characteristic of a varistor.

Furthermore, the bridging element may comprise material additives, for example oxides such as bismuth, antimony, cobalt, manganese, nickel, chromium or silicon oxides. Advantageously one or more of these material additives may purposefully adjust the nonlinear resistance behavior of the bridging element.

In a preferred configuration, the bridging element comprises two bridging layers, which are separated from one another by a boundary surface. The concentration of material additives may for example be higher at the boundary surface than in the two bridging layers. When breakdown voltage is reached, breakdown proceeds in particular across, preferably perpendicular to, the boundary surface. Breakdown may proceed in a horizontal or vertical direction. The vertical direction may run perpendicular to a plane in which the carrier extends. The horizontal direction may accordingly run parallel to a plane in which the carrier extends.

In particular, the bridging element may comprise more than two bridging layers, which are each separated from one another by a boundary surface. A main plane of extension of the boundary surface may here run parallel, within the bounds of manufacturing tolerances, to a main plane of extension of the bridging layers.

Furthermore, the bridging element may contain one or more dopants.

According to a further embodiment, the bridging element may contain or consist of a metal or a metallic compound. Examples of suitable materials are Ti, Ag, Pt, Au or Cu. When such materials are used, the bridging element in particular has the characteristic of a diode.

According to at least one embodiment, the bridging element comprises at least one bridging layer. In particular, the bridging element consists of at least one bridging layer. Furthermore, the bridging layer is preferably arranged outside the semiconductor material of the semiconductor layer sequence. This means in particular that the bridging layer is not an epitaxial layer. In this way, optical losses in the semiconductor layer sequence may be reduced. Alternatively or in addition, "outside the semiconductor material of the semiconductor layer sequence" may mean that the bridging layer is not completely covered at its outer faces by the semiconductor material of the semiconductor layer sequence. The bridging layer may for example be applied at and/or on an outer face of the semiconductor layer sequence. The bridging layer may for example contain a polycrystalline electroceramic material or consist thereof.

In one advantageous configuration, the bridging layer is patterned and has a plurality of bridging regions, which are separated from one another by interspaces, in which the bridging layer is interrupted.

According to at least one embodiment, the bridging element is provided at the semiconductor layer sequence. "Arranged at the semiconductor layer sequence" may mean here and hereinafter that the bridging element is situated in direct physical contact with the semiconductor layer sequence. In particular, the bridging element may directly adjoin the first semiconductor region, the active zone and/or the second semiconductor region.

In one preferred configuration, the bridging element connects the first and the second semiconductor regions together and/or one semiconductor region with the respective contact. In particular, the bridging element may connect the first and second semiconductor regions directly together. In this case, it is possible for the bridging element to be in direct contact with at least one of the two semiconductor regions. In particular, the bridging element may cover the pn junction. Furthermore, the bridging element may connect the first and second contacts together. "Cover" may mean here and hereinafter that the bridging element at least partially covers over the pn junction in a lateral plan view onto the pn junction. In this case, it is in particular possible for the bridging element to extend laterally from the first semiconductor region across the active zone to the second semiconductor region. "A lateral plan view" may here and hereinafter in particular be a plan view perpendicular to a main plane of extension of the semiconductor layer sequence.

In a preferred configuration, the bridging element comprises a bridging layer which is applied on the semiconductor layer sequence. The bridging layer is preferably in direct contact with the semiconductor layer sequence. The bridging layer may extend from the first contact to the second contact and cover the pn junction laterally. The current/voltage behavior of the bridging element is here in particular determined by the interaction of semiconductor layer sequence and bridging layer. The bridging layer may for example form a contact with ohmic resistance with the second semiconductor region of the second conductivity type and a contact with nonlinear resistance with the first semiconductor region of the first conductivity type. Here the current/voltage behavior of the bridging element may have the characteristic of a Schottky diode. In particular, the bridging element has a breakdown voltage which in the forward direction is above the operating voltage of the semiconductor layer sequence and in the reverse direction is below the breakdown voltage of the semiconductor layer sequence. In the case of discharge pulses in the reverse direction, the latter are then advantageously discharged via the bridging element and not via the active zone. Furthermore, the current/voltage behavior of the bridging element may have the characteristic of a varistor. Advantageously, the breakdown voltage of the varistor is below the breakdown voltage of the active zone both in the forward direction and in the reverse direction.

According to at least one embodiment, the semiconductor layer sequence comprises a first major face facing the carrier and a second major face remote from the carrier and at least one side face, which extends at an angle, i.e. not parallel, to the first and second major faces. The first and second major faces may here extend along a main plane of extension of the semiconductor layer sequence.

In one preferred configuration, the bridging element or the bridging layer is arranged on a side face of the semiconductor layer sequence. In particular, the bridging element or the bridging layer is in direct contact with the first and second semiconductor regions. Furthermore, the bridging element or the bridging layer advantageously extends from the first contact over a side face of the first and second semiconductor regions as far as the second contact. The first contact may for example be arranged on the second major face. The second contact may be provided on a part of the second semiconductor region projecting beyond the first semiconductor region. In this case, the distance between the two contacts is smaller than in the event of the second contact being arranged on the first major face, such that the length of the bridging element extending from the first to the second contact is also smaller. The resistance of the bridging element may advantageously be influenced inter alia by the length thereof.

In a preferred embodiment, the pn junction is covered by an electrically insulating coating, which is arranged between the semiconductor layer sequence and the bridging element and/or the bridging layer, such that the active zone is electrically insulated from the bridging element and/or the bridging layer.

In one further configuration, the bridging element may be provided on an inner face of the semiconductor layer sequence. The semiconductor layer sequence may for example comprise a recess which is delimited by the inner face. The recess preferably extends from the first major face, through the first semiconductor region and the active zone in the direction of the second major face as far as into the second semiconductor region. In particular, the bridging layer is arranged on the inner face. Furthermore, the bridging layer may be in direct contact with the first and second semiconductor regions. In addition, the bridging layer may advantageously extend from the first contact, which in particular is arranged on the first major face, over the inner face as far as the second contact, which is preferably arranged within the recess.

According to at least one embodiment, a major part of the radiation generated is outcoupled from the semiconductor chip through the second major face. The second major face is preferably not covered by the first and second contacts. In other words, the second major face may, in plan view, be free of the first and second contacts. Advantageously, absorption losses caused by the contacts may thereby be reduced.

In one preferred configuration, the semiconductor layer sequence is energized on the carrier side. This means that both contacts are provided at the carrier.

According to at least one embodiment, at least one of the two contacts comprises a contact element. The second contact may for example have a contact element which is arranged in the recess of the semiconductor layer sequence. In particular, the contact element is surrounded peripherally by the bridging element. The bridging element may be applied in the form of a coating onto the inner face of the semiconductor layer sequence which delimits the recess. In normal operation the bridging element may replace an insulation layer.

In one preferred configuration, the first contact comprises a contact layer which is interrupted by an opening. The contact element of the second contact preferably extends through the opening in the contact layer of the first contact. Particularly preferably, the contact layer and the contact element are connected together by the bridging element.

In one preferred configuration, the first contact and the second contact in each case comprise a contact layer, these being connected together by the bridging element. In particular, the contact layer of the first contact is arranged between the carrier and the first semiconductor region. Furthermore, the contact layer of the second contact may also be arranged between the carrier and the first semiconductor region.

In normal operation, i.e. below a breakdown voltage, of the semiconductor chip, the bridging element is not electrically conductive, such that it acts as an insulator and may advantageously replace an insulation layer. When breakdown voltage is reached, the bridging element advantageously becomes electrically conductive and electrical charge may be discharged via the bridging element. In this way, the pn junction may be protected from damaging discharge pulses.

In one advantageous configuration, the surface of the semiconductor layer sequence is pretreated at the points where the bridging element is to be formed. For example, localized passivation, plasma treatment or localized etching of the semiconductor layer sequence may be undertaken, in order in particular to influence electrical conductivity at the junction between semiconductor layer sequence and bridging element.

Overall, the current/voltage behavior of the bridging element may be adjusted as desired by a suitable material selection for the bridging element and/or a suitable pretreatment of the semiconductor layer sequence and/or a suitable geometry.

According to at least one embodiment, the bridging element is provided at the carrier.

In one preferred configuration, the carrier comprises a base body. Furthermore, the carrier preferably comprises at least one connection element, which is electrically connected with the first or second contact. In other words, at least one of the contacts is in particular electrically connected by means of the carrier and/or the connection element. The connection element may be at least partially embedded in the base body and/or arranged on the base body.

In one advantageous configuration, the carrier comprises a first and a second connection element, these being connected together by the bridging element. The connection may here in particular be a mechanical connection. It is additionally possible for the first and second connection elements in each case to directly adjoin the bridging element. In particular, the first connection element is electrically connected with the first contact and the second connection element with the second contact. Preferably, the first connection element and the second connection element are electrically insulated from one another by means of the bridging element, if the semiconductor chip is being operated in the forward direction. In this case, it is possible for the bridging element to be arranged between the first and second connection elements and to cover all outer faces of the first and/or second connection elements which face the respective other connection element. Furthermore, the bridging element advantageously becomes electrically conductive when a breakdown voltage is reached in the reverse direction, such that electrical charges may be discharged from the semiconductor chip via the carrier.

According to at least one embodiment, the first connection element comprises a first through-via, which extends from a front surface as far as a rear surface of the base body and is electrically connected with the first contact. Furthermore, the second connection element may comprise a second through-via, which extends from the front as far as the rear surface and is electrically connected with the second contact.

Furthermore, the first connection element may comprise a first connection layer arranged on the base body, which is electrically connected with the first contact. The second connection element may comprise a second connection layer arranged on the base body, which is electrically connected with the second contact.

According to at least one embodiment, the base body is formed by the bridging element. Alternatively, the bridging element may be arranged on the front or rear surface of the base body.

In all the arrangement options described, the bridging element, irrespective of whether it is provided against the semiconductor layer sequence or against the carrier, is integrated into the semiconductor chip, such that the semiconductor chip is advantageously of compact configuration.

Furthermore, it is possible, with an optoelectronic semiconductor chip described here, for the bridging element to withstand a plurality of overvoltage pulses without substantial changes to its electrical behavior. In this way, it is possible to increase the stability of the semiconductor chip relative to electrostatic discharges and/or electrical overload. In addition, dispensing with external protective elements allows manufacturing costs to be reduced.

Figure 5A:
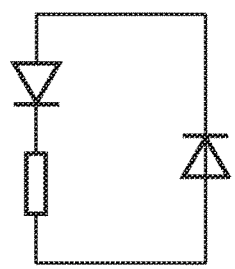
Figure 5B:
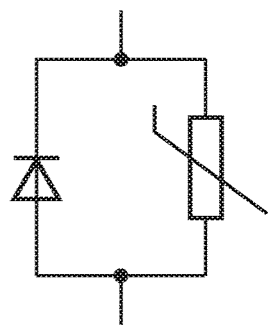
Figure 13:
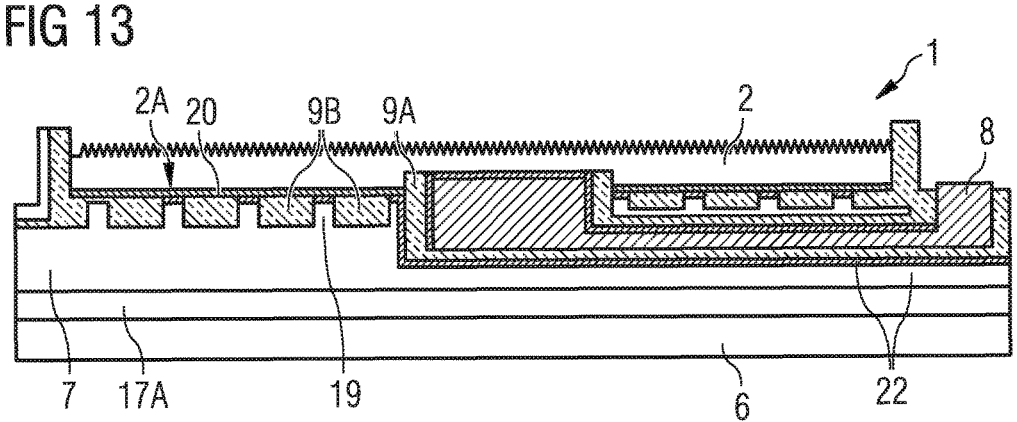
Figure 14:
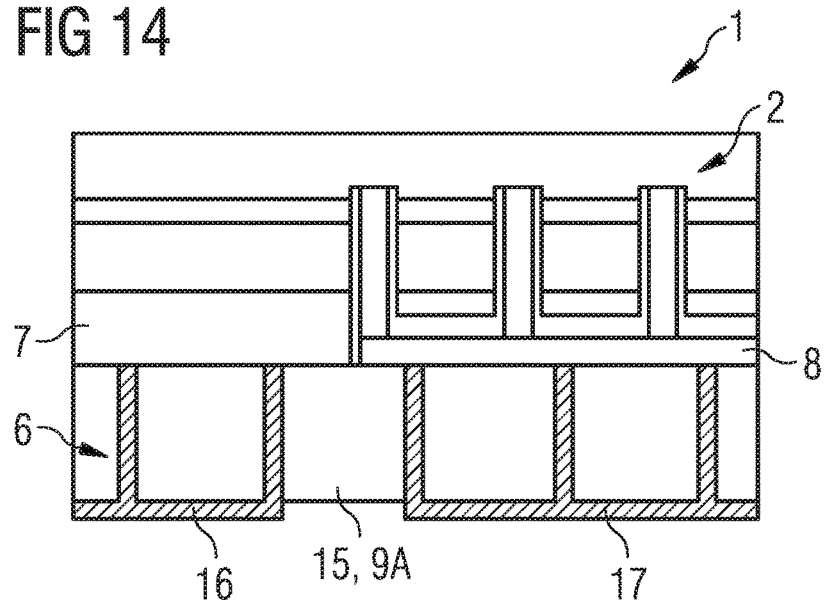
Figure 15:
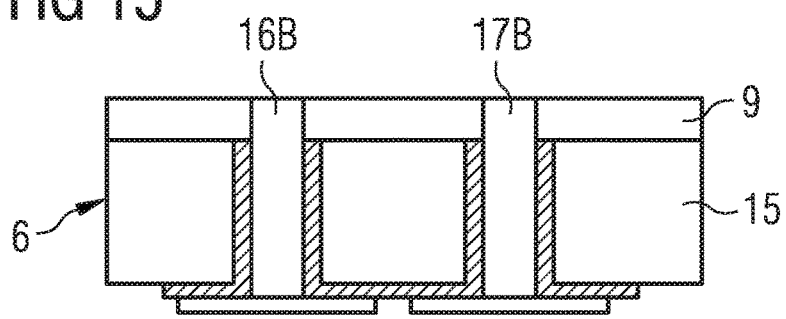
Figure 16:
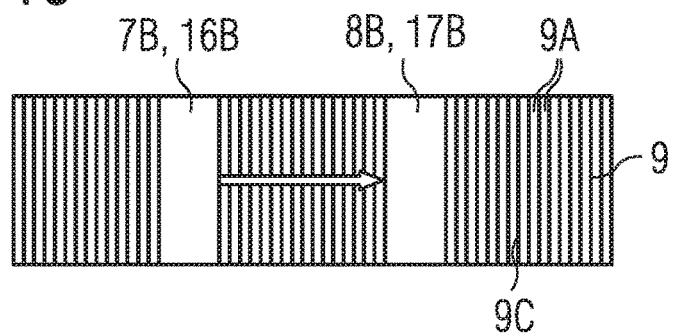
Figure 17:
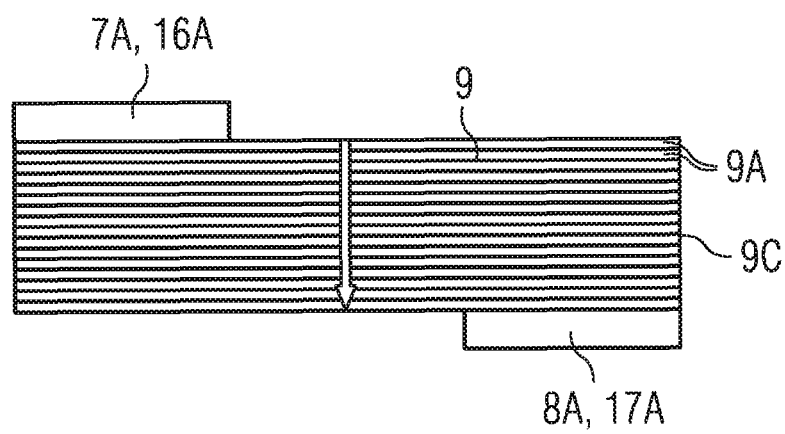
Figure 18:
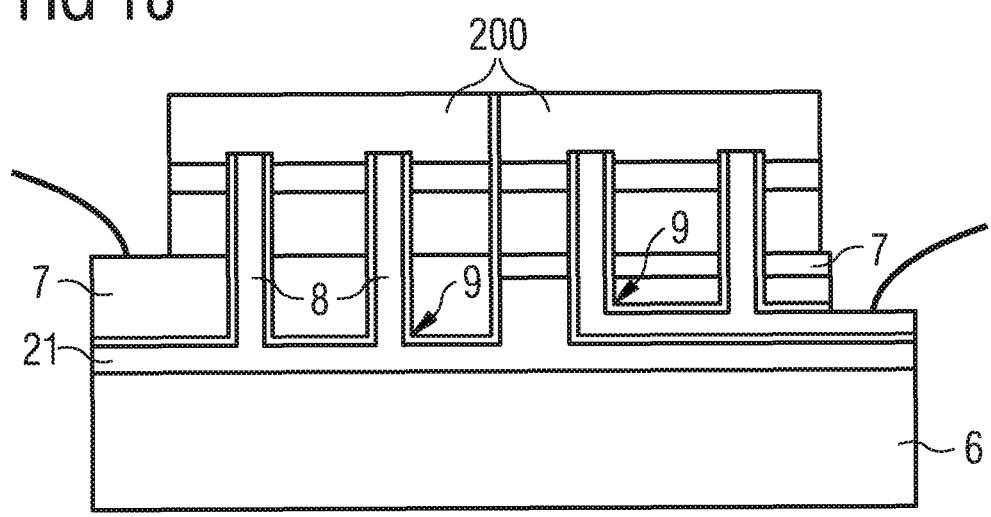

Further advantages, advantageous embodiments and further developments are revealed by the exemplary embodiments described below in conjunction with FIGS. 1 to 18, in which:

FIGS. 1, 2 and 6 to 14 show schematic cross-sectional views of various exemplary embodiments of an optoelectronic semiconductor chip described here, FIGS. 3 and 15 show schematic cross-sectional views of portions of various exemplary embodiments of an optoelectronic semiconductor chip described here, FIG. 4 shows a schematic cross-sectional view of a portion of an optoelectronic semiconductor chip described here according to one exemplary embodiment, FIG. 5A a possible equivalent circuit diagram therefor, and FIG. 5b a further possible equivalent circuit diagram, FIGS. 16 and 17 show schematic cross-sectional views of portions of various exemplary embodiments of a multilayer bridging element, FIG. 18 shows a schematic cross-sectional view of an arrangement with a plurality of semiconductor layer stacks.

FIG. 1 shows an exemplary embodiment of an optoelectronic semiconductor chip 1, which comprises a semiconductor layer sequence 2 with a first semiconductor region 3 of a first conductivity type and a second semiconductor region 4 of a second conductivity type. In particular, the first semiconductor region 3 is a p-conductive region and the second semiconductor region 4 is an n-conductive region. An active zone 5 with a pn junction is formed between the first semiconductor region 3 and the second semiconductor region 4. In particular, the active zone 5 is provided for generating radiation. The semiconductor layer sequence 2 is preferably made from a nitride compound semiconductor.

Furthermore, the optoelectronic semiconductor chip 1 comprises a carrier 6, on which the semiconductor layer sequence 2 is arranged. The carrier 6 may for example contain sapphire or consist of sapphire. Such a carrier 6 is particularly suitable for growing a semiconductor layer sequence 2, which is made from a nitride compound semiconductor. Moreover, such a carrier 6 is advantageously transmissive to the radiation generated by the active zone 5, such that the radiation may be outcoupled from the semiconductor chip 1 through the carrier 6.

The semiconductor layer sequence 2 comprises a first major face 2A, which is arranged on a side of the active zone 5 facing the carrier 6. Furthermore, the semiconductor layer sequence 2 comprises a second major face 2B, which is arranged on a side of the active zone 5 remote from the carrier 6. In addition, the semiconductor layer sequence 2 comprises a plurality of side faces 2C, which are arranged transversely of the major faces 2A, 2B.

The optoelectronic semiconductor chip 1 comprises a first contact 7, which is provided for electrical connection of the first semiconductor region 3 and is in particular a p-contact, and a second contact 8, which is provided for electrical connection of the second semiconductor region 4 and in particular is an n-contact. The first contact 7 is arranged on the second major face 2B. The second contact 8 is arranged on a sub-region 4A of the second semiconductor region 4 projecting beyond the first semiconductor region 3.

The optoelectronic semiconductor chip 1 comprises a bridging element 9, which is arranged at a side face 2C of the semiconductor layer sequence 2. The bridging element 9 comprises a bridging layer 9A, which is arranged outside the semiconductor layer sequence 2. The bridging layer 9A covers the pn junction of the active zone 5. The bridging layer 9a additionally extends from the first contact 7 as far as the second contact 8.

The current/voltage behavior of the bridging element 9 may in particular be determined by the interaction of semiconductor layer sequence 2 and bridging layer 9A. The bridging layer 9A may here for example form a contact with ohmic resistance with the second semiconductor region 4 and a contact with nonlinear resistance with the first semiconductor region 3. The bridging element 9 in particular has the characteristic of a Schottky diode. The bridging layer 9A may for example contain or consist of a metal or a metallic compound. Examples of suitable materials are Ti, Ag, Pt, Au or Cu. In particular, the bridging element 9 has a breakdown voltage which in the forward direction is above the operating voltage of the semiconductor layer sequence 2 and in the reverse direction is below the breakdown voltage of the semiconductor layer sequence 2. When the breakdown voltage is reached in the reverse direction, electrical charge is advantageously discharged via the bridging element 9 and not via the active zone 5.

Furthermore, the bridging element 9 may have the characteristic of a varistor. Advantageously, the breakdown voltage of the varistor is below the breakdown voltage of the semiconductor layer sequence 2 both in the forward direction and in the reverse direction, such that when breakdown voltage is reached the electrical charge is advantageously discharged via the bridging element 9, and not via the active zone 5.

The bridging element 9 and/or the bridging layer 9A in particular contains a polycrystalline electroceramic material. Suitable electroceramic materials are for example sintered semiconductor materials. Materials such as zinc oxide, strontium oxide, strontium titanate, titanium oxide and silicon carbide may in particular be considered for the bridging element 9. Furthermore, the bridging element may comprise material additives, for example oxides such as bismuth, antimony, cobalt, manganese, nickel, chromium or silicon oxides. Advantageously one or more of these material additives may purposefully adjust the nonlinear resistance behavior of the bridging element 9.

The side face 2C of the semiconductor layer sequence 2 may be pretreated prior to application of the bridging layer 9A. For example, passivation, plasma treatment or etching of the semiconductor layer sequence may be undertaken, in order purposefully to adjust the electrical resistance of the bridging element 9. Furthermore, the electrical resistance of the bridging element 9 may be purposefully influenced by the length L of the bridging layer 9A.

The optoelectronic semiconductor chip 1 according to a further exemplary embodiment shown in FIG. 2 comprises a semiconductor layer sequence 2 with a recess 10. The recess 10 is delimited peripherally by an inner face 2D of the semiconductor layer sequence 2 and additionally by a base surface 2E of the semiconductor layer sequence 2. The recess 10 extends from the first major face 2A, through the first semiconductor region 3 and the active zone 5 as far as into the second semiconductor region 4. In particular, the recess 10 is arranged centrally. Furthermore, the recess 10 may take the form of a truncated cone. The bridging element 9 is arranged at the inner face 2D. The bridging element 9 comprises a bridging layer 9A which covers the active zone 5.

The first contact 7 is arranged at the first major face 2A. The first contact 7 is applied as a coating onto the first major face 2A. Furthermore, the second contact 8 is arranged at the base surface 2E of the semiconductor layer sequence 2 and is in particular applied thereto as a coating. The bridging layer 9A extends from the first contact 7 over the inner face 2D as far as the second contact 8. The bridging layer 9A may advantageously comprise the materials already mentioned in conjunction with the exemplary embodiment of FIG. 1 and exhibit the current/voltage behavior described. In normal operation the current thus flows predominantly through the active zone 5 while, in the case of overvoltages, the current is discharged via the bridging element 9, so protecting the active zone 5.

The semiconductor layer sequence 2 is arranged on a carrier 6, which differs in particular from a growth substrate used for growth of the semiconductor layer sequence 2. The carrier 6 is preferably formed of a metal or a metal compound. The carrier 6 may for example be produced by galvanic reinforcement of a metallic starting layer. The carrier 6 is advantageously electrically conductive and serves in electrical contacting of the second contact 8. The carrier 6 may extend as far as into the recess 10.

The semiconductor chip 1 comprises an insulating layer 11, which covers the carrier 6 on surfaces which face the first major face 7 and the inner face 2D. The insulating layer 11 prevents an electrical connection between first contact 7 and carrier 6.

In this exemplary embodiment, a major part of the radiation generated in the active zone 5 is outcoupled from the semiconductor chip 1 through the second major face 2B. The semiconductor layer sequence 2 advantageously comprises patterning on the second major face 2B, in particular roughening. This may improve outcoupling efficiency.

In the exemplary embodiments illustrated in FIGS. 1 and 2, the bridging element 9 and/or the bridging layer 9A is/are in each case arranged at the semiconductor layer sequence 2.

FIG. 3 shows a possible variation of the exemplary embodiments shown in FIGS. 1 and 2. Here the active zone 5 may be covered laterally with an electrically insulating coating 12, which is arranged between the semiconductor layer sequence 2 and the bridging element 9, such that the active zone 5 is electrically insulated from the bridging element 9.

FIG. 4 shows a portion of a semiconductor chip, for example according to one of the exemplary embodiments shown in FIGS. 1 and 2, in the region of the active zone 5. The bridging element 9 may comprise a nonlinear and an ohmic resistance through the interaction of bridging layer 9A and semiconductor layer sequence 2. The nonlinear resistance may have the characteristic of a Schottky diode. In the equivalent circuit diagram, the current/voltage behavior of the bridging element 9 may be represented by an ohmic resistance and a diode, which is connected in series to the ohmic resistance. Furthermore, the current/voltage behavior of the active zone 5 is represented by a diode. For the semiconductor chip 1 the result is a circuit arrangement in which the diode is connected antiparallel to the Schottky diode and parallel to the ohmic resistance (cf. FIG. 5A).

Furthermore, the bridging element 9 may have the characteristic of a varistor, resulting in a circuit arrangement in which the diode is connected parallel to the varistor (cf. FIG. 5B).

FIG. 6 shows a further exemplary embodiment of an optoelectronic semiconductor chip 1. Here the semiconductor layer sequence 2 is energized on the carrier side. In particular, the carrier 6 is electrically conductive and serves in electrical contacting of one of the two semiconductor regions 3, 4, preferably in electrical contacting of the second semiconductor region 4. To this end, the carrier 6 is connected electrically with the second contact 8. The second contact 8 comprises a contact layer 8A, which is connected electrically and mechanically with the carrier 6 and covers the latter on a front surface facing the semiconductor layer sequence 2. Furthermore, the second contact 8 comprises a plurality of contact elements 8B, which are connected with the contact layer 8A and arranged transversely of, in particular perpendicular to, the latter.

The semiconductor layer sequence 2 comprises a plurality of recesses 10, which extend from the first major face 2A through the first semiconductor region 3 and the active zone 5 as far into the second semiconductor region 4. A contact element 8B is preferably arranged in each recess 10.

Furthermore, the semiconductor chip 1 comprises a first contact 7, which comprises a contact layer 7A and a contact pad 7B. The contact layer 7A is arranged between the contact layer 8A of the second contact 8 and the semiconductor layer sequence 2. In particular, the contact layer 7A of the first contact 7 is in direct contact with the first semiconductor region 3. Advantageously, the contact layer 7A serves in electrical contacting of the first semiconductor region 3.

The contact layer 7A comprises a plurality of openings 13, wherein in particular in each case one opening 13 is arranged in the region of one recess 10. Preferably, in each case one contact element 8B of the second contact 8 extends through one opening 13 in the contact layer 7A.

The semiconductor chip 1 comprises a bridging element 9, which comprises a bridging layer 9A which is arranged between the contact layer 7A of the first contact 7 and the contact layer 8A of the second contact 8. The bridging element 9 and/or the bridging layer 9A may be formed with an electroceramic material and/or a metal oxide. In normal operation, the two contact layers 7A, 8A are thus electrically insulated from one another by the bridging layer 9A.

The bridging element 9 comprises further bridging layers 9A, which are arranged in the recesses 10 and openings 13. In particular, each contact element 8B is surrounded peripherally by a bridging layer 9A. In normal operation, each contact element 8B may be electrically insulated peripherally from the contact layer 7A and the semiconductor layer sequence 2.

The contact pad 7B is arranged on a sub-region of the contact layer 7A which projects beyond the semiconductor layer sequence 2. The contact pad 7B may be connected with an electrical conductor 14.

FIG. 7 shows a further exemplary embodiment of an optoelectronic semiconductor chip 1. In this case, the semiconductor layer sequence 2 is energized on the carrier side as in the exemplary embodiment illustrated in FIG. 6. However, the carrier 6 is configured to be electrically insulating. The first and second contacts 7, 8, each comprise a contact layer 7A, 8A, these being arranged on the carrier 6 and projecting beyond the semiconductor layer sequence 2. These may each be connected on the free regions of the contact layers 7A, 8A not covered by the semiconductor layer sequence 2 with an electrical conductor 14.

In this exemplary embodiment the bridging element 9 forms an almost complete encapsulation for the second contact 8. Only the ends of the contact elements 8B and the free region of the contact layer 8A, with which the electrical conductor 14 is connected, are not covered by the bridging element 9, such that in normal operation current may be impressed into the second semiconductor region 4 via the electrical conductor 14 and the second contact 8.

A further exemplary embodiment of an optoelectronic semiconductor chip 1, in which the semiconductor layer sequence 2 is energized on the carrier side, is shown in FIG. 8. In this case, the carrier 6 comprises a base body 15 together with a first connection element 16 for electrical contacting of the first contact 7 and a second connection element 17 for electrical contacting of the second contact 8. The two connection elements 16, 17 each comprise a connection layer 16A, 17A and a plurality of through-vias 16B, 17B. The connection layers 16A, 17A are arranged on a rear surface of the base body 15 remote from the semiconductor layer sequence 2. The through-vias 16B, 17B extend from a front surface of the base body 15 facing the semiconductor layer sequence 2 as far as the rear surface of the base body 15. The semiconductor layer sequence 2 may be energized via the connection elements 16, 17. The base body 15 preferably contains an electrically insulating material.

The bridging element 9 is arranged between the second contact 8 and the first contact 7 as well as between the second contact 8 and the semiconductor layer sequence 2 and in normal operation acts as an insulator. In the case of overvoltages the bridging element 9 becomes electrically conductive, such that electrical charge may be discharged from the semiconductor chip 1 via the bridging element 9 and the carrier 6.

Figure 9:
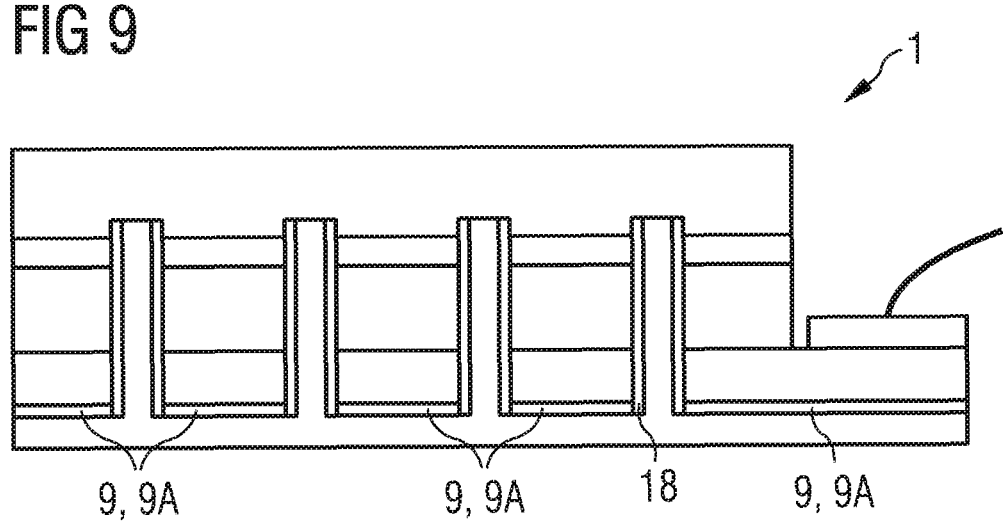

The exemplary embodiment of an optoelectronic semiconductor chip 1 illustrated in FIG. 9 shows a variation of the bridging element 9 which is also feasible in the case of the exemplary embodiments shown in FIGS. 6 to 8.

In this case, the bridging layers 9A, which peripherally surround the contact elements 8B, are replaced by passivation layers 18. In particular, the passivation layers 18 are not electrically conductive either in normal operation or in the case of overvoltages, such that the electrical charge in the case of overvoltages can only be discharged via the bridging element 9 arranged between the two contact layers 7A, 8A.

Figure 10:
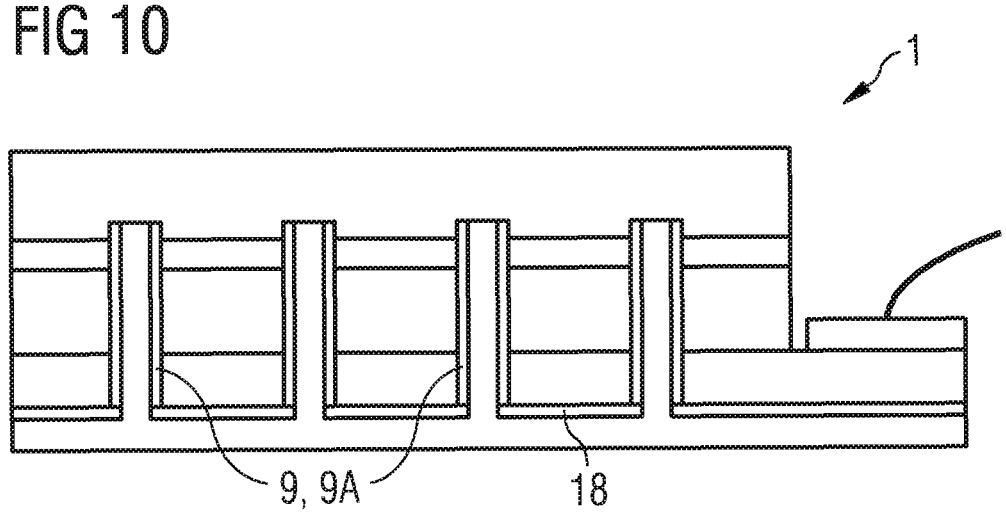

Alternatively, the bridging layer 9A arranged between the two contact layers 7A, 8A may be replaced by a passivation layer 18, as is shown in the exemplary embodiment of an optoelectronic semiconductor chip 1 illustrated in FIG. 10.

Figure 11:
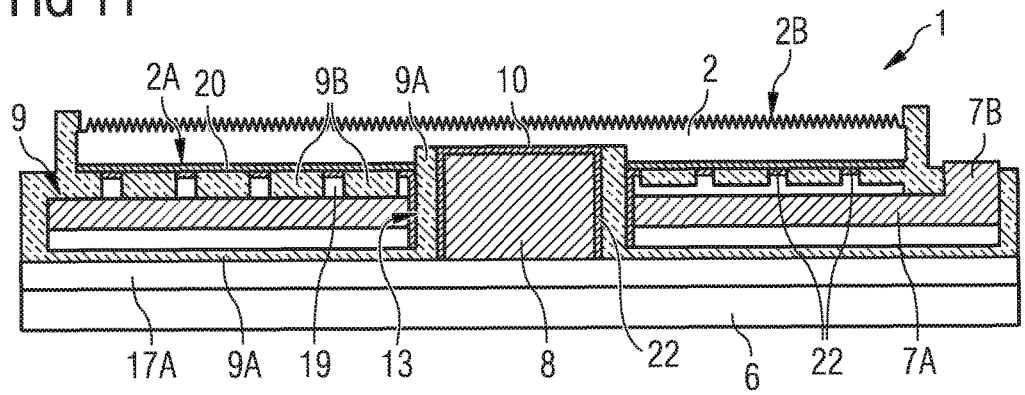
Figure 12:
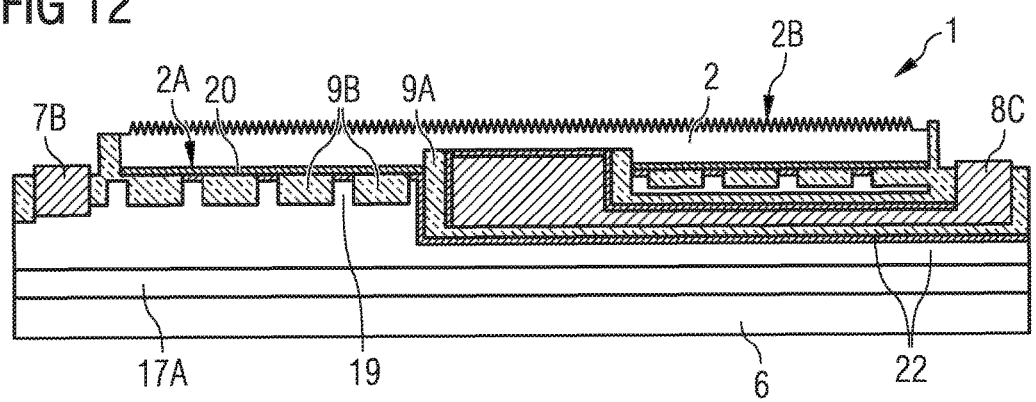

FIGS. 11 to 13 show further exemplary embodiments of optoelectronic semiconductor chips 1 which are energized on the carrier side. Furthermore, the bridging elements 9 according to the exemplary embodiments illustrated in FIGS. 11 to 13 are patterned. In particular, the bridging elements 9 comprise a plurality of bridging regions 9B, which are separated from one another by interspaces 19. In the case of the exemplary embodiments illustrated, the bridging regions 9B are arranged at the first major face 2A, such that the first major face 2A is partially covered by the bridging regions 9B. For example, one of the two contacts 7, 8, preferably the first contact 7, extends as far as into the interspaces 19. To reduce contact resistance, an electrically conductive layer 20 may be arranged between the semiconductor layer sequence 2 and the contact 7, 8 arranged in the interspaces 19. Preferably, the electrically conductive layer 20 is formed from a transparent conductive oxide. In normal operation, current is impressed into the semiconductor layer sequence 2 via the interspaces 19. When breakdown voltage is reached, discharge pulses are discharged inter alia via the bridging regions 9B, such that the active zone 5 may be protected.

In the exemplary embodiment illustrated in FIG. 11, a recess 10, in which part of the second contact 8 is provided, is arranged at a central point in the semiconductor layer sequence 2. Furthermore, the first contact 7 comprises a contact layer 7A with an opening 13, in which a further part of the second contact 8 is arranged. The second contact 8 extends as far as a connection layer 17A arranged on the carrier 6 and is connected mechanically and electrically therewith. In particular, the connection layer 17A simultaneously serves to fasten the semiconductor layer sequence 2 to the carrier 6. In particular, the carrier 6 is electrically conductive.

Between the first contact 7 and the carrier 6 a bridging layer 9A of the bridging element 9 is arranged, such that in normal operation the first contact 7 is electrically insulated from the carrier 6. A contact region 7B is provided on a region of the contact layer 7A not covered by the semiconductor layer sequence 2. In this exemplary embodiment, the first contact 7 comprises, in addition to the contact layer 7A, still further layers 22 which are in particular reflective. A reflective layer 22 may also be arranged between the second contact 8 and a bridging layer 9A surrounding the second contact 8. Overall, the outcoupling efficiency of the radiation emitted via the second major face 2B may be improved by the reflective layers 22.

In the exemplary embodiment illustrated in FIG. 12, the contact regions 7B, 8C of the two contacts are arranged laterally of the semiconductor layer sequence 2 on opposing sides. In this case, the carrier 6 may in particular be of electrically insulating configuration.

In the exemplary embodiment illustrated in FIG. 13, the first contact 7 is electrically conductively connected with the carrier 6. Furthermore, the carrier 6 is in particular electrically conductive, such that the semiconductor layer sequence 2 may be electrically connected via the carrier 6 and the first contact 7.

FIG. 14 shows a further exemplary embodiment of an optoelectronic semiconductor chip 1, in which the bridging element 9 is provided on the carrier side. In particular, the bridging element 9 comprises a bridging layer 9A which forms the base body 15 of the carrier 6. The through-vias of the connection elements 16, 17 are embedded in the base body 15.

In the exemplary embodiment of a carrier 6 illustrated in FIG. 15, the bridging element 9 is arranged on the carrier side. The bridging element 9 is part of the carrier 6 and is provided on a front surface of the base body 15. A semiconductor layer sequence may be arranged on the bridging element 9. Alternatively, the bridging element 9 may be arranged on a rear surface of the base body 15, which in the finished semiconductor chip is remote from the semiconductor layer sequence. The through-vias 16B, 17B of the connection elements are embedded in the bridging element 9. For example, the carrier 6 may consist of a semiconductor material, preferably silicon.

FIG. 16 shows an exemplary embodiment of a bridging element 9 which connects a contact region 7B of a first contact with a contact element 8B of a second contact or connects together two through-vias 16B, 17B. The bridging element 9 comprises a plurality of bridging layers 9A, which are each separated from one another by a boundary surface 9C. In particular, the concentration of material additives at the boundary surface 9C is higher than in the adjoining bridging layers 9A. When breakdown voltage is reached, breakdown proceeds in particular across, preferably perpendicular to, the boundary surface 9C (cf. arrow). In this exemplary embodiment, breakdown proceeds in a horizontal direction. The horizontal direction runs in particular parallel to a plane in which the carrier extends.

FIG. 17 shows an exemplary embodiment of a bridging element 9 in which breakdown proceeds in a vertical direction (cf. arrow). The vertical direction runs in particular perpendicular to a plane in which the carrier extends. The bridging element 9 connects a contact layer 7A of a first contact with a contact layer 8A of a second contact or a connection layer 16A of a first connection element with a connection layer 17A of a second connection element. The bridging element 9 comprises a plurality of bridging layers 9A, which are each separated from one another by a boundary surface 9C. In particular, the concentration of material additives at the boundary surface 9C is higher than in the adjoining bridging layers 9A.

FIG. 18 shows an exemplary embodiment of an arrangement with a plurality of semiconductor layer stacks 200, which are arranged on a common carrier 6. The individual semiconductor layer stacks 200 have a similar structure to the semiconductor chips already described. An electrically conductive bonding layer 21 is arranged between the semiconductor layer stacks 200 and the carrier 6. This connects the first contact 7 of the one semiconductor layer stack 200 with the second contact 8 of the adjacent semiconductor layer stack 200. In this way, the semiconductor layer stacks 200 are connected in series. In particular, the bridging element 9 is arranged between the bonding layer 21 and the respective contacts 7, 8, which adjoin the bonding layer 21.

The present application claims priority from German patent application 10 2013 112 881.5, the disclosure content of which is hereby included by reference.

The invention is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic semiconductor chip comprising:
   a semiconductor layer sequence containing semiconductor material, which sequence comprises a first semiconductor region of a first conductivity type and a second semiconductor region of a second conductivity type and an active zone with a pn junction, which is formed between the first and the second semiconductor region;
   a carrier, on which the semiconductor layer sequence is arranged;
   a first contact, which is provided for electrical connection of the first semiconductor region;
   a second contact different from the first contact, which second contact is provided for electrical connection of the second semiconductor region; and
   a bridging element connected parallel or antiparallel to the semiconductor layer sequence, which bridging element comprises a nonlinear electrical resistance, which is higher in the case of an operating voltage of the optoelectronic semiconductor chip in the forward direction than an electrical resistance of the semiconductor layer sequence and is lower in the case of overvoltages in the reverse direction than the electrical resistance of the semiconductor layer sequence, such that electrical charge is discharged via the bridging element in the case of overvoltages, wherein the bridging element comprises at least one bridging layer, which is arranged outside the semiconductor material of the semiconductor layer sequence,
   wherein the semiconductor layer sequence comprises a recess,
   wherein the second contact comprises a contact element, which is arranged in the recess,
   wherein the contact element is surrounded peripherally by the bridging element, wherein the bridging element connects together the first and second semiconductor regions and/or one semiconductor region with the respective contact, and
   wherein the first contact comprises a contact layer, which is interrupted by an opening, through which the contact element extends.

2. The optoelectronic semiconductor chip according to claim 1, wherein the bridging layer is not an epitaxial layer.

3. The optoelectronic semiconductor chip according to claim 1, wherein the bridging element and/or the bridging layer contain(s) a polycrystalline electroceramic material.

4. The optoelectronic semiconductor chip according to claim 1, wherein the bridging element connects together the first and second contacts.

5. The optoelectronic semiconductor chip according to claim 1, wherein the bridging element is provided at the semiconductor layer sequence.

6. The optoelectronic semiconductor chip according to claim 1, wherein the semiconductor layer sequence comprises a first major face facing the carrier and a second major face remote from the carrier and one side face, which extends at an angle to the first and second major faces, and wherein the bridging layer is arranged on the side face.

7. The optoelectronic semiconductor chip according to claim 1, wherein the recess delimited by an inner face of the semiconductor layer sequence, and wherein the bridging layer is arranged on the inner face.

8. The optoelectronic semiconductor chip according to claim 1, wherein the first contact comprises a first contact layer and the second contact comprises a second contact layer, the first contact layer and the second contact layer being connected together by the bridging element.

9. The optoelectronic semiconductor chip according to claim 1, wherein the bridging element comprises at least one of the following materials: zinc oxide, strontium oxide, strontium titanate, titanium oxide, silicon carbide.

10. The optoelectronic semiconductor chip according to claim 1, wherein the bridging element contains at least one of the following material additives: bismuth oxide, antimony oxide, cobalt oxide, manganese oxide, nickel oxide, chromium oxide and silicon oxide.

11. The optoelectronic semiconductor chip according to claim 1, wherein the bridging element is a varistor, a Schottky diode or a Zener diode.

12. An optoelectronic semiconductor chip comprising:
   a semiconductor layer sequence containing semiconductor material, which sequence comprises a first semiconductor region of a first conductivity type and a second semiconductor region of a second conductivity type and an active zone with a pn junction, which is formed between the first and the second semiconductor region;
   a carrier, on which the semiconductor layer sequence is arranged;
   a first contact, which is provided for electrical connection of the first semiconductor region,
   a second contact different from the first contact, which second contact is provided for electrical connection of the second semiconductor region; and
   a bridging element connected parallel or antiparallel to the semiconductor layer sequence, which bridging element comprises a nonlinear electrical resistance, which is higher in the case of an operating voltage of the optoelectronic semiconductor chip in the forward direction than an electrical resistance of the semiconductor layer sequence and is lower in the case of overvoltages in the reverse direction than the electrical resistance of the semiconductor layer sequence, such that electrical charge is discharged via the bridging element in the case of overvoltages, wherein the bridging element comprises at least one bridging layer, which is arranged outside the semiconductor material of the semiconductor layer sequence,
   wherein the bridging element is provided at the carrier, and wherein the carrier comprises a base body and at least one connection element, which is connected electrically with the first or second contact and is at least partially embedded into the base body and/or is arranged on the base body, and
   wherein the carrier comprises a first connection element, which is connected electrically with the first contact, and a second connection element, which is connected electrically with the second contact, and wherein the first and second connection elements are connected together by the bridging element.

* * * * *